United States Patent [19]

Nakamura et al.

[11] Patent Number: 5,677,397

[45] Date of Patent: Oct. 14, 1997

[54] EPOXY RESIN COMPOSITION

[75] Inventors: Hideo Nakamura; Terufumi Suzuki; Kiyomi Yasuda, all of Ichihara, Japan

[73] Assignee: Mitsui Petrochemical Industries, Ltd., Tokyo, Japan

[21] Appl. No.: 663,375

[22] Filed: Jun. 13, 1996

Related U.S. Application Data

[63] Continuation of Ser. No. 231,304, Apr. 22, 1994, abandoned.

[51] Int. Cl.$^6$ .............................. C08F 283/10; C08G 8/10; C08L 63/04
[52] U.S. Cl. .............................. 525/481; 525/523; 528/87
[58] Field of Search ........................... 525/481, 523; 528/87

[56] References Cited

U.S. PATENT DOCUMENTS

| | | | |
|---|---|---|---|
| 4,073,826 | 2/1978 | Galkiewicz et al. | 260/831 |
| 4,297,473 | 10/1981 | Koshibe et al. | 525/481 |
| 4,342,852 | 8/1982 | Takeda et al. | 525/481 |
| 4,499,215 | 2/1985 | Okada | 525/54.5 |
| 4,529,790 | 7/1985 | Kamio et al. | 525/504 |
| 4,755,543 | 7/1988 | Bertram et al. | 525/481 |
| 5,151,496 | 9/1992 | Bertram et al. | 525/481 |

FOREIGN PATENT DOCUMENTS

| | | |
|---|---|---|
| 2238727 | 2/1975 | France . |
| 2299359 | 8/1976 | France . |
| 52-45630 | 4/1977 | Japan . |
| 60-88079 | 5/1985 | Japan . |
| 6314820 | 1/1991 | Japan . |
| 2265374 | 9/1993 | United Kingdom . |

*Primary Examiner*—Randy Gulakowski
*Attorney, Agent, or Firm*—Sherman and Shalloway

[57] ABSTRACT

An epoxy resin composition which exhibits a low dielectric constant and a low dielectric dissipation factor as well as an excellent working susceptibility after its curing is provided. The epoxy resin composition contains at least one member selected from a novolak resin (A) prepared by condensing formalin and an alkylphenol compound; and an epoxy resin (B) prepared by glycidylating said novolak resin (A) with an epihalohydrin.

7 Claims, No Drawings

EPOXY RESIN COMPOSITION

This application is a continuation of application Ser. No. 08/231,304, filed Apr. 22, 1994 which is now abandoned.

BACKGROUND OF THE INVENTION

This invention relates to an epoxy resin composition. More particularly, this invention relates to an epoxy resin composition which exhibits a low dielectric constant and a low dielectric dissipation factor as well as an excellent working susceptibility after its curing.

Recent widening in the applications of electric and electronic components are remarkable, and nowadays, a large number of electric and electronic components are used, not only in computers, but also in automatic control, communication, business and game machines and equipment. In packaging such electric and electronic components, printed wiring boards are used to construct an electric or electronic circuit. A laminate comprising a stack of several sheets of pregregs impregnated with an epoxy resin is used in such construction of the printed wiring boards.

Due to the miniaturization and the improvement in the performance of the electronic equipment, there is a strong demand for the laminates to have a lower dielectric constant. Increase in operation speed of a computer has been realized by use of a more fine circuit pattern of a higher density. Such efforts, however, are facing their physical limit, and there is a serious demand for decreasing the dielectric loss of the insulating laminate to consequently enable an increase in the operation speed.

The laminate used as a circuit substrate in satellite communication also needs to have a lower dielectric dissipation factor in order to decrease transmission loss, and a material for the laminate needs to have a lower dielectric constant in order to enable fabrication of a circuit of an appropriate size.

In view of such a situation, various attempts have been made to use polyethylene resins and fluoroplastics as a material for fabricating the laminate.

However, the laminates fabricated by using such a polyethylene resin or fluoroplastic suffer from defects such as:

(1) an insufficient moldability leading to a high temperature in molding;

(2) a poor dimensional stability; and (3) a lower adhesion with the overlying copper cladding.

Alternatively, the dielectric dissipation factor of the laminate can be decreased by using a quartz material instead of the glass material used for fabricating the laminate. The thus produced laminates, however, suffer from a faster drill abrasion upon working, and in particular, upon drilling of the laminate.

SUMMARY OF THE INVENTION

In view of such a situation, an object of the present invention is to provide an epoxy resin composition which exhibits a low dielectric constant and a low dielectric dissipation factor after its curing, and which also exhibits an excellent working susceptibility after its curing.

According to the present invention, there is provided an epoxy resin composition comprising (A) a novolak resin prepared by condensing formalin and a phenol compound represented by the general formula (I):

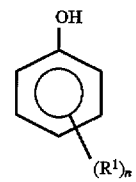

wherein $R^1$ is an alkyl radical having 4 to 12 carbon atoms and n is an integer of from 1 to 5; and (B) an epoxy resin prepared by glycidylating said novolak resin with an epihalohydrin.

DETAILED DESCRIPTION OF THE INVENTION

The epoxy resin composition of the present invention comprises (A) a novolak resin and (B) an epoxy resin prepared by glycidylating said novolak resin.

The novolak resin (A) is prepared by condensing formalin and a phenol compound represented by the general formula (I):

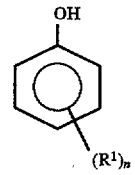

in the presence of a catalyst. In the general formula (I), $R^1$ may represent an alkyl radical having 4 to 12 carbon atoms, and more preferably, 6 to 9 carbon atoms, and n may represent an integer of from 1 to 5. Exemplary phenol compounds include alkylphenols such as p-octylphenol, p-nonylphenol, p-hexylphenol, and p-pentylphenol. Among such alkylphenols, the preferred are those wherein the carbon atom in the most vicinity of the benzene nucleus is quaternary carbon in order to provide the resulting cured composition with a low dielectric constant and a high glass transition temperature. It should be noted that the phenol compound may be used alone or in combination of two or more.

It should also be noted that paraformaldehyde may be used instead of the formalin.

The formalin and the phenol compound represented by the general formula (I) may generally be used at a formalin/phenol compound molar ratio of from 0.2 to 1.05, and more preferably, from 0.5 to 0.9 to provide the composition of the present invention with an improved heat resistance after curing.

Exemplary catalysts used for the condensation of the formalin and the phenol compound include acids such as sulfuric acid, hydrochloric acid, nitric acid, phosphoric acid, and p-toluenesulfonic acid. Among such acids, the most preferred is p-toluenesulfonic acid for its high acidity, and good compatibility with the reagents. Such a catalyst is typically used in an amount of 0.5 to 5% by mole.

The novolak resin (A) used in the present invention may preferably have a number average molecular weight of from about 400 to about 1,800, and more preferably, from about 600 to about 1,600 to provide the resulting composition with an improved heat resistance after curing and an adequate melt viscosity, and hence, a good flowability upon processing to enable a sufficient impregnation into a glass cloth upon production of a laminate.

The epoxy resin component (B) used in the present invention may be prepared by glycidylating the novolak resin (A) as described above with an epihalohydrin.

Among the novolak resin (A) as described above, those which are used in the preparation of the epoxy resin (B) may preferably have a number average molecular weight in the range of from 400 to 1,600, and most preferably, from 600 to 1,400 to provide the resulting composition with an improved heat resistance after curing and an adequate melt viscosity, and hence, a good flowability upon processing to enable a sufficient impregbation into a glass cloth upon production of a laminate.

Typical epihalohydrins which may be used for the glycidylation of the novolak resin (A) include epichlorohydrin and β-methylepichlorohydrin.

In the preparation of the epoxy resin (B) of the present invention, the novolak resin (A) and the formalin may be reacted in accordance with various conventional processes, for example, (a) by simultaneously promoting etherification and dehydrohalogenation, and (b) by sequentially promoting etherification and dehydrohalogenation. The more advantageous is the process (b) wherein the etherification and the dehydrohalogenation are sequentially promoted in view of the stable quality of the resulting epoxy resin.

In the process (a) wherein the etherification and the dehydrohalogenation are simultaneously promoted, the novolak resin (A) and the epihalohydrin are reacted at a temperature of from about 60° to about 90° C. in the presence of an alkaline compound and in the presence of water to simultaneously promote the etherification and the dehydrohalogenation. The remaining halohydrins and water as well as salt byproducts are then removed from the reaction mixture, and the residue is dried to obtain the epoxy resin (B).

The alkaline compounds which may be used include alkaline metal hydroxides such as sodium hydroxide, potassium hydroxide, and lithium hydroxide, among which sodium hydroxide being the most preferred.

In such a process (a), the alkaline compound may be used in an amount of at least 1.0 mole, and more preferably, in an amount of from 1.02 to 1.05 mole per 1 equivalent of the phenolic hydroxyl radical in the novolak resin (A).

In the process (b) wherein the etherification and the dehydrohalogenation are sequentially promoted, the etherification may be promoted in the presence of an etherification catalyst selected from, for example, tertiary amines such as trimethylamine, triethylamine, etc.; tertiary phosphines such as triphenylphosphine, tributylphosphine, etc.; quaternary ammonium salts such as tetramethylammonium chloride, tetramethylammonium bromide, tetraethylammonium chloride, tetraethylammonium bromide, choline chloride, etc.; quaternary phosphonium salts such as tetramethylphosphonium bromide, tetramethylphosphonium iodide, triphenylpropylphosphonium bromide, etc.; tertiary sulfonium salts such as benzyldibutylsulfonium chloride, benzyldimethylsulfonium chloride, etc. Among these, the most preferred are quaternary ammonium salts.

Such an etherification catalyst may be used in an amount of from 0.005 to 5% by mole per 1 equivalent of the phenolic hydroxyl radical in the novolak resin (A).

In the etherification step, the reaction may be allowed to proceed until at least 30%, preferably at least 50%, and more preferably, at least 80% of the hydroxyl radical in the novolak resin (A) are etherified. The etherification reaction may typically be promoted at a temperature of from about 60° to about 110° C. for about 1 to about 12 hours, and preferably, in the absence of the water. If the water is present in the reaction system, it is preferable to adjust the content of the water to up to 3.0% by weight.

The reaction product of the etherification step including the unreacted epihalohydrin is subsequently subjected to the dehydrohalogenation step. The dehydrohalogenation is promoted in the presence of a catalyst, which may be an alkaline compound used in the above-described etherification step, for example, an alkaline metal hydroxide, which may preferably be sodium hydroxide.

In the dehydrohalogenation step, the alkaline compound may be used in an amount of at least 0.5 mole, and more preferably, in an amount of at least 0.8 mole per 1 equivalent of the phenolic hydroxyl radical in the novolak resin (A). Use of the alkaline compound in an amount of more than 1 mole per 1 equivalent of the phenolic hydroxyl radical may preferably be avoided to prevent inconvenience such as gelation of the reaction product.

The dehydrohalogenation may typically be effected at a temperature of from about 60° to about 100° C. for about 1 to about 3 hours. When sodium hydroxide is used for the catalyst, the reaction may be preferably proceeded with the byproduct water being removed from the reaction system. Such water removal may be effected, for example, by utilizing azeotropy between epihalolohydrin and water at a reduced pressure. In such a case, the epihalorohydrin may be recycled into the reaction system.

After the completion of the reaction, the remaining epihalohydrin may be removed from the reaction product by distillation at a reduced pressure, and byproduct salts may be removed by washing of the reaction product with water. If necessary, the reaction product may be neutralized with a weak acid such as phosphoric acid and sodium phosphate dihydrate. The reaction product may be then dried to obtain the epoxy resin (B).

The thus produced epoxy resin (B) may have an epoxy equivalent of up to 800 g/eq, and preferably, up to 600 g/eq, and more preferably, up to 400 g/eq in order to obtain a composition exhibiting a sufficient impregnation in the production of a laminate.

The composition of the present invention comprises the above-described novolak resin (A) and the epoxy resin (B). The composition of the present invention, comprising both the novolak resin (A) and the epoxy resin (B), will exhibit a significantly reduced dielectric constant after its curing. In such a case, the composition may contain the novolak resin (A) and the epoxy resin (B) at a ratio R represented by the formula (1):

$$R = \frac{\frac{\text{Weight of the novolak resin }(A)}{\text{Hydroxyl equivalent of the novolak resin }(A)}}{\frac{\text{Weight of the epoxy resin }(B)}{\text{Epoxy equivalent of the epoxy resin }(B)}} \quad (1)$$

of from 0.9 to 1.05, and preferably, from 0.95 to 1.0.

The composition of the present invention may also contain other epoxy compounds to a content that would not adversely affect the advantageous features of the present composition. Examples of such other epoxy compounds include bisphenol A epoxy resins, bisphenol F epoxy resins, 1,1-bis(glycidoxyphenyl)ethane, phenol novolak epoxy compounds, o-cresol novolak epoxy compounds, glycidyl ester epoxy compounds, glycidyl amine epoxy compounds, alicyclic epoxy compounds, and trisphenol epoxy compounds. Examples of the trisphenol epoxy compounds include epoxy compounds of 1-[α-methyl-α(4'-hydroxyphenyl)ethyl]-4-[α'-α'-bis(4'-hydroxyphenyl)ethyl] benzene, and epoxy compounds of 1,1,3-tris(2-methyl-4-hydroxy-5-tert-butylphenyl)butane.

In order to obtain a flame retardant product upon curing of the present composition, a diglycidyl ether of tetrabromobisphenol A may be added to the composition.

The composition of the present invention may also contain various optional components other than the above-mentioned reagents. Such components include, non-reactive diluents, for example, phthalates, glycol ethers, glycol esters, and phenols; reactive diluents such as long chain alkylene oxides, butyl glycidyl ether, phenyl glycidyl ether, and p-butyl phenyl glycidyl ether; modified polybutadiene, and modified carboxyl-terminated butadieneacrylonitrile copolymer; fillers, for example, calcium carbonate, clay, asbestos, silica, mica, powdered quartz, powdered aluminum, graphite, titanium oxide, alumina, iron oxide, powdered glass, and glass fiber; colorants such as carbon black, toluidine red, Hansa yellow, phthalocyanine blue, and phthalocyanine green.

In preparing the epoxy resin composition of the present invention, the above-described components may be mixed by melting the components at an elevated temperature, or by dissolving the above-described components in an appropriate solvent.

The heat-melting may be effected at a temperature about 20° to 50° C. higher than the melting points of the components.

The solvents which may be used include toluene, xylene, methylethylketone, dioxane, and methylcellosolve.

For curing the composition of the present invention, a mixture of the novolak resin (A) and/or the epoxy resin (B) and the optionally added components is blended with a curing agent, and optionally, with a curing accelerator, and the resulting mixture is heated to a temperature of from 120° to 180° C. for 1 to 8 hours.

The curing agent which may be used in combination with the epoxy resin composition of the present invention is not limited to any particular type. Typical curing agents include polyfunctional phenol compounds, acid anhydrides, aromatic polyamines, aliphatic polyamines, and imidazoles.

Exemplary polyfunctional phenol compounds include phenolic novolaks, o-cresol novolaks, 1-[α-methyl-α(4'-hydroxyphenyl)ethyl]-4-[α'-α'-bis(4'-hydroxyphenyl)ethyl]-benzene, and 1, 1,3-tris (2-methyl-4-hydroxy-5-tert-butylphenyl)butane.

Exemplary acid anhydrides include phthalic anhydride, hexahydrophthalic anhydride, methyltetrahydrophthalic anhydride, methylhexahydrophthalic anhydride, methyl-naphthalenedicarboxylic anhydride, pyromellitic anhydride, trimellitic anhydride, benzophenonetetracarboxylic anhydride, dodecylsuccinic anhydride, and chloronor-bornenedicarboxylic anhydride.

Exemplary aromatic polyamines include diaminodiphenylmethane and diaminodiphenyl sulfone.

Exemplary aliphatic polyamines include triethylenetetramine, diethylenetriamine, menthenediamine, N-aminoethylpiperadine, isophoronediamine, and 3,9-bis(3-aminopropyl)-2,4,8,10-tetraspiro[5,5]undecane.

Exemplary imidazoles include 2-methylimidazole, 2-ethyl-4-methylimidazole, 2-phenylimidazole, 2-undecylimidazole, 2-ethyl-4-methylimidazole azine, and 1-benzyl-2-methylimidazole.

Curing agents such as dicyanediamide, m-xylylenediamine may also be used in the present invention.

In the present invention, the curing agents as mentioned above may be used either alone or in combination of two or more.

Exemplary curing accelerators include imidazoles as mentioned above and tertiary amines.

Exemplary tertiary amines include N,N-benzyldimethylamine and 2,4,6-tris(dimethylaminomethyl) phenol.

Other exemplary curing accelerators are 1,8-diazabicyclo-[5,4,0]-undecene-7 octylate, complex compounds of monoethylamine and trifluoroborane, 1-benzyl-2-methylimidazole, 2-ethyl-4-methylimidazole, and the compound commercially available from Sun Abbot Inc. with the trade name Ucat SA102.

In the present invention, the curing accelerators may be used alone or in combination of two or more.

In the curing of the present composition, the curing agent may typically be used in an amount such that the ratio of the epoxy equivalent of the epoxy resin (B) to the equivalent of active hydrogen of the curing agent is in the range of from 0.4 to 1.20, and preferably, from 0.8 to 1.05. When the curing agent used is an acid anhydride, it is used in an amount so that the ratio of the epoxy equivalent of the epoxy resin (B) to the molar amount of the acid anhydride would fall within the above-mentioned range. When a curing accelerator is used, it is typically used in an amount of from 0.1 to 3 parts by weight per 100 parts by weight of the epoxy resin (B).

The composition of the present invention is quite adequate for producing copper-clad laminates, laminates of a low dielectric constant, potting materials of a low dielectric constant, and the like. In the production of a copper-clad laminate, the composition of the present invention is first dissolved in a solvent to prepare a varnish, and then, a matrix such as a glass cloth, a nonwoven glass fabric, a synthetic fabric, or paper is impregnated or coated with the varnish. The thus impregnated or coated matrix is heat dried to remove the solvent and produce a prepreg, which may be stack one on another to form a laminate. The laminate is clad with a copper sheet on one or both surfaces, and heat and pressure are applied to the laminate to promote the curing of the present composition to thereby produce the copper-clad laminate.

The present invention is described in further detail by referring to the following Examples of the invention and Comparative Examples.

EXAMPLES

In the following Examples, glass transition temperature, dielectric constant, dielectric dissipation factor, copper-cladding peel strength, soldering resistance, and flame retardancy were measured in accordance with the methods as described below.

Glass transition temperature, Tg,

Glass transition temperature, Tg was evaluated with the differential scanning calorimeters as described below under the conditions as described below.

Differential scanning calorimeter:

Seiko 1DSC100

Seiko 1 SSC5040 (Disk Station)

Conditions of the evaluation:

Temperature range: 25° to 200° C.

Temperature elevation rate: 10° C./min

Sampling period: 0.5 sec

Sampling amount: 10 mg

Dielectric constant and dielectric dissipation factor

Dielectric constant and dielectric dissipation factor were evaluated with dielectric loss measuring apparatus (model TR-10C, manufactured by Ando Electric K.K.) in accordance with JIS K6911.

Copper cladding-peel strength

A prepreg was prepared by impregnating a glass cloth of 100 μm thick (WEA116E105F, manufactured by Nitto Boseki Co., Ltd.) with the epoxy resin composition. On one surface of the stack of five sheets of the prepreg was disposed a copper foil of 35 μm thick (3EC-3, manufactured by Mitsui Metal K.K.), and the stack was pressed at a temperature of 170° C. and at a pressure of 40 kgf/cm² for 60 minutes to prepare a copper-clad laminate. A sample for evaluating peel strength of the copper cladding was cut out of the thus prepared copper-clad laminate in accordance with JIS C6481. The sample copper-clad laminate was evaluated for its copper cladding-peel strength at a peel angle of 90° (kgf/cm (N/cm)) in accordance with JIS C6481 by securing one end of the previously peeled copper cladding (thickness, 37 µm) at one chuck of the tensile tester and peeling the copper cladding under normal conditions.

Soldering resistance

Soldering resistance was evaluated in accordance with JIS C6481. A sample was prepared by removing all of the copper clad on one surface of the copper-clad laminate and half of the copper clad on the other surface of the copper-clad laminate. The sample was treated under the conditions of C-3/121/100 (in air at a temperature of 121° and a relative humidity of 100%), and then, immersed in a soldering bath at a temperature of 260° C. to evaluate for the presence of blisters.

Flame retardancy The laminate was evaluated for its flame retardancy by a vertical flame test in accordance with UL 94.

Example 1

To a reactor equipped with a reflux condenser, a stirrer, and a thermometer were charged 909.3 g of p-octylphenol and 8.4 g of p-toluenesulfonic acid monohydrate. The reactor was purged with nitrogen and the mixture was heated to a temperature of 95° C. Next, while maintaining the temperature at a reflux temperature of 98° to 99° C. and purging the reactor with nitrogen, 303.7 g of 37% formalin was added to the mixture from a dropping funnel at a constant rate for 2 hours. The mixture was refluxed for another 15 minutes after the completion of the formalin addition, and the reflux condenser was replaced with a simple distillation apparatus. The temperature was gradually raised to 130° C. to distill off methanol and water. The temperature was further raised to a final temperature of 150°0 C. while reducing the pressure to a final pressure of 15 mmHg and purging the reactor with nitrogen. Low-boiling compounds were distilled off by retaining the temperature and the pressure for 30 minutes. The pressure within the reactor was restored to the normal pressure, and 800 ml of toluene was added to the reaction mixture to form a uniform toluene solution, which was neutralized with 1 liter of 10% aqueous solution of sodium hydrogen carbonate. The toluene solution was washed with 500 ml of water, and azeotropically dehydrated at 150° C. The reaction mixture was filtered through a glass filter (G4). The filtrate was heated in an oil bath of 150° C. at a reduced pressure of 15 mmHg to distill off the toluene, and then, heated in an oil bath of 220° C. at a reduced pressure of not more than 5 mmHg for 2 hours to remove the residual monomer and thereby produce 914 g of novolak resin.

The number average molecular weight (Mn) and the weight average molecular weight (Mw) of the resulting novolak resin was measured to be 1,162 and 1,714, respectively. The hydroxyl equivalent was 219 g/eq and the softening point was 110° C.

Example 2

The procedure of Example 1 was repeated except that the p-octyl phenol, the p-toluenesulfonic acid monohydrate, and the 37% formalin were used in an amount of 5,000 g, 46.0 g and 1,279 g, respectively. There was produced 4,815 g of the novolak resin.

The resulting novolak resin had a number average molecular weight (Mn) of 1,048, a weight average molecular weight (Mw) of 1,240, a hydroxyl equivalent of 220 g/eq and a softening point of 86° C.

Example 3

The procedure of Example 1 was repeated except that 909.3 g of the p-octyl phenol, 303.7 g of the 37% formalin, and 8.4 g of the p-toluenesulfonic acid monohydrate used in Example 1 were replaced with 1,160 g of p-nonyl phenol, 384.6 g of 37% formalin and 1.0 g of p-toluenesulfonic acid. There was produced 1,158 g of the novolak resin.

The resulting novolak resin had a number average molecular weight (Mn) of 935, a weight average molecular weight (Mw) of 1,603, a hydroxyl equivalent of 235 g/eq and a softening point of 59° C.

Example 4

A 2 liter reactor equipped with a thermometer was charged with 438 g of the novolak resin produced in Example 1, 920 g of epichlorohydrin, 0.88 g of 50% aqueous solution of tetramethylammonium chloride, and 26.8 g of water, and the mixture was stirred and allowed to react at a temperature of 90° C. for 4 hours. The temperature was then reduced to 70° C., and 162.5 g of 48% aqueous sodium hydroxide was added to the reaction mixture for 2 hours, while concentration of the water in the reactor was maintained at a constant level of about 2% by weight by utilizing the azeotropy between the epichlorohydrin and the water at a reduced pressure to remove the water from the reaction mixture and leave the epichlorohydrin in the reaction mixture. The reaction mixture was stirred for another 30 minutes after the completion of the addition of the aqueous sodium hydroxide to allow for the reaction to proceed. After the completion of the reaction, the reaction mixture was gradually heated to a temperature of 120° C. while distilling off the remaining epichlorohydrin at a reduced pressure. Next, 550 g of toluene and 370 g of warm water were added to the reaction mixture, and the reaction mixture was stirred for 30 minutes under reflux to recover the toluene phase. The thus recovered toluene phase was azeotropically dehydrated, and insolubles were filtered off by filtration through a glass filter (G4) covered with celite to obtain the reaction product dissolved in toluene. Toluene was distilled off the toluene solution at a temperature of 150° C. and at a reduced pressure to leave 350 g of epoxy resin.

The epoxy equivalent of the resulting epoxy resin was measured to be 522 g/eq. The epoxy resin also had a hydrolyzable chlorine content of 0.007% by weight and a softening point of 101° C.

Example 5

A 2 liter reactor equipped with a thermometer was charged with 400 g of the novolak resin produced in Example 1, 837 g of epichlorohydrin, 4.0 g of 50% aqueous solution of tetramethylammonium chloride, and 22.7 g of water, and the mixture was stirred and allowed to react at a temperature of 90° C. for 5 hours. The temperature was then reduced to 70° C., and 142 g of 48% aqueous sodium hydroxide was added to the reaction mixture for 2 hours, while concentration of the water in the reactor was maintained at a constant level of about 2% by weight by utilizing the azeotropy between the epichlorohydrin and the water at a reduced pressure to remove the water from the reaction mixture and leave the epichlorohydrin in the reaction mixture. The reaction mixture was stirred for another 30 minutes after the completion of the addition of the aqueous sodium hydroxide to allow for the reaction to proceed. After the completion of the reaction, the reaction mixture was gradually heated to a temperature of 120° C. while distilling off the remaining epichlorohydrin at a reduced pressure. Next, 500 g of xylene and 320 g of warm water were added to the reaction mixture, and the reaction mixture was stirred for 30 minutes under reflux to recover the xylene phase. The thus recovered xylene phase was azeotropically dehydrated, and insolubles were filtered off by filtration through a glass filter (G4) covered with celite to obtain the reaction product dissolved in xylene. Xylene was distilled off the xylene solution at a temperature of 150° C. and at a reduced pressure to leave 470 g of epoxy resin.

The epoxy equivalent of the resulting epoxy resin was measured to be 378 g/eq. The epoxy resin also had a hydrolyzable chlorine content of 0.007% by weight and a softening point of 78° C.

Example 6

A 2 liter reactor equipped with a thermometer was charged with 400 g of the novolak resin produced in Example 1, 837 g of epichlorohydrin, 8.0 g of 50% aqueous solution of tetramethylammonium chloride, and 21.0 g of water, and the mixture was stirred and allowed to react at a temperature of 90° C. for 5 hours. The temperature was then reduced to 70° C., and 127 g of 48% aqueous sodium hydroxide was added to the reaction mixture for 2 hours, while concentration of the water in the reactor was maintained at a constant level of about 2% by weight by utilizing the azeotropy between the epichlorohydrin and the water at a reduced pressure to remove the water from the reaction mixture and leave the epichlorohydrin in the reaction mixture. The reaction mixture was stirred for another 30 minutes after the completion of the addition of the aqueous sodium hydroxide to allow for the reaction to proceed. After the completion of the reaction, the reaction mixture was gradually heated to a temperature of 120° C. while distilling off the remaining epichlorohydrin at a reduced pressure. Next, 500 g of xylene and 290 g of warm water were added to the reaction mixture, and the reaction mixture was stirred for 30 minutes under reflux to recover the xylene phase. The thus recovered xylene phase was azeotropically dehydrated, and insolubles were filtered off by filtration through a glass filter (G4) covered with celite to obtain the reaction product dissolved in xylene. Xylene was distilled off the xylene solution at a temperature of 150° C. and at a reduced pressure to leave 480 g of epoxy resin.

The epoxy equivalent of the resulting epoxy resin was measured to be 377 g/eq. The epoxy resin also had a hydrolyzable chlorine content of 0.009% by weight and a softening point of 55° C.

Example 7

A separable flask was charged with 22.9 g of the novolak resin obtained in Example 1 and 59 g of the epoxy resin obtained in Example 4. The reaction mixture was heat melted at 180° C. and deaerated, and 0.12 g of 2-methylimidazole was added to the mixture to prepare epoxy resin composition. The resulting epoxy resin composition was cast into a rectangular mold of 2 mm (thickness) ×15 cm (length)×and 15 cm (width), press-molded at 170° C. for 8 hours, and cooled. The resulting plate of cured epoxy resin composition was released from the mold. The Tg of the cured epoxy resin composition was measured to be 136° C. The cured epoxy resin composition also had a dielectric constant (1 MHz) of 2.60 and a dielectric dissipation factor (1 MHz) of 0.009.

Example 8

The procedure of Example 7 was repeated except that the novolak resin of Example 1 was replaced with 24.5 g of the novolak resin produced in Example 3 to produce a plate of cured epoxy resin composition. The cured epoxy resin composition had a Tg of 118° C., a dielectric constant (1 MHz) of 2.65, and a dielectric dissipation factor (1 MHz) of 0.009.

Example 9

A 1 liter separable flask was charged with 104 g of the novolak resin produced in Example 1 and 216 g of the novolak epoxy resin produced in Example 4. The mixture was stirred and heated to 150° C. to melt the mixture. To the thus molten mixture was added 222 g of methylethylketone. The resulting solution had a solid content of 65%. After cooling the solution to room temperature, 3.0 g of 2-ethyl-4-methylimidazole was added to the solution to produce a varnish. The resulting varnish had a gelation time at 140° C. of 13 minutes 30 seconds.

A glass cloth (WEA18W105F115N, manufactured by Nitto Boseki Co., Ltd.) was impregnated with the thus produced varnish, and dried at 140° C. for 10 minutes to produce a prepreg. A stack of 9 sheets of the prepreg was press-molded at 170° C. for 3 hours to produce a laminate of 1.74 mm thick having a resin content of 35%.

The Tg (DSC) of the laminate was measured to be 135° C. The laminate also had a dielectric constant (1 MHz) of 3.92 and a dielectric dissipation factor (1 MHz) of 0.007.

Example 10

A 1 liter separable flask was charged with 35.1 g of the novolak resin produced in Example 1, 25.1 g of the novolak epoxy resin produced in Example 4, and 39.5 g of diglycidylated tetrabromobisphenol A having an epoxy equivalent of 396 g/eq and a bromine content of 48.1%. The mixture was stirred and heated to 150° C. to melt the mixture. To the thus molten mixture was added 4.5 g of methylethylketone. The resulting solution had a solid content of 65%. After cooling the solution to room temperature, 0.8 g of 2-ethyl-4-methylimidazole was added to the solution to produce a varnish. The resulting varnish had a gelation time at 150° C. of 9 minutes 43 seconds.

A glass cloth (WEA18W105F115N, manufactured by Nitto Boseki Co., Ltd.) was impregnated with the thus produced varnish, and dried at 150° C. for 5 minutes to produce a prepreg. A stack of 10 sheets of the prepreg was press-molded at 170° C. for 3 hours to produce a laminate 1.1 mm thick having a resin content of 46%.

The Tg (DSC) of the laminate was measured to be 144° C. The laminate also had a dielectric constant (1 MHz) of 3.8 and a dielectric dissipation factor (1 MHz) of 0.008. The copper cladding-peel strength was 1.0 kgf/cm, and the soldering resistance at C-3/121/100 was fair with no blisters. The flame retardancy was V-0 in accordance with the criteria of UL-94.

Example 11

A 1 liter separable flask was charged with 27.4 g of the novolak resin produced in Example 2, and 18.1 g of the epoxy resin produced in Example 6, 39.5 g of diglycidylated tetrabromobisphenol A having an epoxy equivalent of 396 g/eq and a bromine content of 48.1%, 10 g of a bisphenol A epoxy resin having an epoxy equivalent of 485 g/eq, and 5 g of 1-[α-methyl-α(4'-hydroxyphenyl)ethyl]-4-[α'-α'-bis(4'-hydroxyphenyl)ethyl]benzene. The mixture was stirred and heated to 150° C. to melt the mixture. To the thus molten mixture was added 45 g of methylethylketone. The resulting solution had a solid content of 65%. After cooling the solution to room temperature, 0.8 g of 2-ethyl-4-methylimidazole was added to the solution to produce a varnish. The resulting varnish had a gelation time at 150° C. of 9 minutes 15 seconds.

A glass cloth (WEA18W105F115N, manufactured by Nitto Boseki Co., Ltd.) was impregnated with the thus produced varnish, and dried at 150° C. for 5 minutes to produce a prepreg. A stack of 10 sheets of the prepreg was press-molded at 170° C. for 3 hours to produce a laminate of 1.0 mm thick having a resin content of 47%.

The Tg (DSC) of the laminate was measured to be 138° C. The laminate also had a dielectric constant (1MHz) of 3.9 and a dielectric dissipation factor (1MHz) of 0.008. The copper cladding-peel strength was 1.4 kgf/cm, and the soldering resistance at C-3/121/100 was fair with no blisters. The flame retardancy was V-0 in accordance with the criteria of UL-94.

Example 12

A reactor equipped with a stirrer, a reflux condenser, a dropping funnel and a thermometer was charged with 393.8 g of 1,1-bis(2-methyl-4-hydroxy-5-tert-butylphenyl)butane, 1,221 g of epichlorohydrin, and 33 g of water, and the reaction mixture was heated to a temperature of 70° C. When the 1,1-bis(2-methyl-4-hydroxy-5-tert-butylphenyl) butane melted, 1.2 g of aqueous solution of tetramethylammonium chloride at a concentration of 53.2% by weight was added, and the reaction mixture was stirred for 2 hours at 70° C. Next, 169.6 g of 48 wt % aqueous sodium hydroxide was added to the reaction mixture at a reduced pressure for 2 hours, while the temperature was maintained at 70° C. and 36.6 g of water was removed from the reaction system by utilizing the azeotropy between the water and the epichlorohydrin. The epichlorohydrin which was distilled off the reaction system with the water was separated from the water, and recycled into the reaction system. The pressure of the reaction system was regulated to equibrate the amount of water removed from the reaction system per unit time with the sum of the water in the aqueous sodium hydroxide added and the water produced in the reaction per unit time.

The mixture was stirred at 70° C. for another half an hour after the completion of the addition of the aqueous sodium hydroxide. The remaining epichlorohydrin and water were then distilled off at a reduced pressure, and 634.6 g of methylisobutylketone and 377 g of water were added to the reaction mixture. The reaction mixture was stirred at 95° C. for half an hour, and allowed to stand for separation into organic and aqueous phases. A sample was aliquoted from the organic phase and the solvent was removed therefrom. Upon analysis, the hydrolyzable chlorine content was 0.58% by weight.

Next, the organic phase was placed in a reactor, and heated to a temperature of 90° C. To the reaction system was then added 9.8 g of 48 wt % aqueous sodium hydroxide, which corresponds to a molar amount 1.5 times the above-mentioned hydrolyzable chlorine content. The reaction mixture was stirred at 90° C. for 2 hours. After completion of the reaction, the reaction mixture was neutralized with 70.4 g of 30 wt % aqueous monosodium phosphate solution, and allowed to stand for separation into organic and aqueous phases. The thus separated organic phase was azeotropically distilled to remove the water content, and filtered through a glass filter to remove inorganic salts. The filtrate was distilled at a reduced pressure to remove the methylisobutylketone and leave 485 g of vitreous epoxy resin. The epoxy resin had an epoxy equivalent of 284 g/eq and a hydrolyzable chlorine content of 0.015% by weight.

Example 13

A 2 liter separable flask was charged with 970 g of the epoxy resin produced in Example 12, 500 g of tetrabromobisphenol, and 160 g of xylene. 2.2 ml of 10% aqueous solution of tetramethylammonium chloride was further added to the mixture. The flask was purged with nitrogen, and the mixture was stirred and heated. When the temperature reached 100° C., the pressure of the reaction system was reduced, and the reaction mixture was heated to 150° C. while xylene and water were removed from the reaction system. The pressure of the reaction system was then restored to the normal pressure, and the reaction mixture was stirred at a temperature of 50° C. for 8 hours to produce 1,470 g of epoxy resin.

The resulting epoxy resin had an epoxy equivalent of 957 g/eq, a softening point of 125° C., and a bromine content of 20% by weight.

Example 14

To 50 g of methylethylketone were dissolved 100 g of the epoxy resin produced in Example 13, 27.3 g of the novolak resin produced in Example 1, and 1.0 g of 2-ethyl-4-methylimidazole to produce a varnish.

A glass cloth (6232/1050/AS450, manufactured by Asahi Shuehbere K.K.) was impregnated with the thus produced varnish, and dried at 170° C. for 5 minutes to produce a prepreg.

A stack of 9 sheets of the prepreg was press-molded at 180° C. for 30 minutes, and then, at 190° C. for 1.5 hours to produce a laminate of 1.3 mm thick having a resin content of 39.5% by weight.

The Tg of the laminate was measured to be 144° C. The laminate also had a dielectric constant (1 MHz) of 3.5 and a dielectric dissipation factor (1 MHz) of 0.0066.

Example 15

A separable flask was charged with 30.0 g of the epoxy resin produced in Example 4, 9.7 g of the methylhexahydrophthalic acid anhydride (Liquacid MH700, manufactured by Shin-nihon Rika K.K.), and 0.15 g of a curing accelerator (U-cat 102SA, manufactured by Sunapro K.K.), and the mixture was heated to 120° C. The molten mixture was deaerated, cast into a rectangular mold of 2 mm (thickness) ×15 cm (length)×15 cm (widths), and cured by heating to 120° C. for 2 hours, 150° C. for 2 hours, and 170° C. for 4 hours. The thus produced plate of the cured epoxy resin composition was cooled, and then, released from the mold.

The resulting cured epoxy resin composition had a Tg of 160° C., a dielectric constant (1 MHz) of 2.90 and a dielectric dissipation factor (1 MHz) of 0.010.

As described above, the epoxy resin composition of the present invention exhibits a low dielectric constant and a low dielectric dissipation factor after its curing. The epoxy resin composition of the present invention also exhibits a high susceptibility for further working after its curing. Accordingly, the epoxy resin composition of the present invention is quite adequate for producing copper-clad laminates, laminates of a low dielectric constant as well as potting materials of a low dielectric constant.

We claim:

1. An epoxy resin composition comprising
   (A) a novolak resin prepared by condensing formalin and a phenol compound represented by the general formula (I):

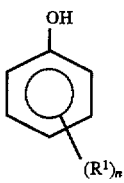

wherein $R^1$ is an alkyl radical having 4 to 12 carbon atoms and n is an integer of from 1 to 5; and
   (B) an epoxy resin prepared by glycidylating a novolak resin (A) with an epihalohydrin.

2. The epoxy resin composition according to claim 1 wherein said novolak resin (A) is a novolak resin prepared by condensing said formalin and said phenol compound at a formalin/phenol compound molar ratio of from 0.2 to 1.05.

3. The epoxy resin composition according to claim 1 wherein said novolak resin (A) is a novolak resin prepared by condensing said formalin and said phenol compound in the presence of p-toluenesulfonic acid as a catalyst.

4. The epoxy resin composition according to claim 1 wherein said novolak resin (A) has a number average molecular weight of from 400 to 1,800.

5. The epoxy resin composition according to claim 1 wherein said novolak resin (A) used in the preparation of the epoxy resin (B) by glycidylation with the epihalohydrin has a number average molecular weight of from 400 to 1,600.

6. The epoxy resin composition according to claim 1 wherein said epoxy resin (B) has an epoxy equivalent of up to 800 g/eq.

7. The epoxy resin composition according to claim 1 wherein said epoxy resin composition contains the novolak resin (A) and the epoxy resin (B) at a ratio R represented by the formula (1):

$$R = \frac{\frac{\text{Weight of the novolak resin }(A)}{\text{Hydroxyl equivalent of the novolak resin }(A)}}{\frac{\text{Weight of the epoxy resin }(B)}{\text{Epoxy equivalent of the epoxy resin }(B)}} \quad (1)$$

of from 0.9 to 1.05.

* * * * *